US005903380A

United States Patent [19]
Motamedi et al.

[11] Patent Number: 5,903,380
[45] Date of Patent: May 11, 1999

[54] MICRO-ELECTROMECHANICAL (MEM) OPTICAL RESONATOR AND METHOD

[75] Inventors: M. Edward Motamedi, Newbury Park; Angus P. Andrews, Westlake; Sangtae Park, Simi Valley, all of Calif.

[73] Assignee: Rockwell International Corp., Thousand Oaks, Calif.

[21] Appl. No.: 08/847,018

[22] Filed: May 1, 1997

[51] Int. Cl.[6] ................................................. G02B 26/08
[52] U.S. Cl. .......................... 359/224; 359/202; 359/223
[58] Field of Search ..................................... 359/196–198, 359/212–214, 223, 224, 290, 291, 295, 199; 310/320, 328, 330–332, 365, 366

[56] References Cited

U.S. PATENT DOCUMENTS

| | | | |
|---|---|---|---|
| 5,295,014 | 3/1994 | Toda | 359/224 |
| 5,579,148 | 11/1996 | Nishikawa et al. | 359/214 |

OTHER PUBLICATIONS

G.F. Marshall and J. Montagu, "Advances in Oscillatory Optical Scanners", *SPIE*, vol. 2382, 1995, pp. 440–448.

H. Goto, K. Imanaka, "Super compact dual axis optical scanning unit applying a tortional spring resonator driven by a piezoelectric actuator", *SPIE*, vol. 1544, Miniature and Micro–Optics: Fabrication and System Applications, 1991, pp. 272–280. (No month).

O. Tabata, R. Asahi, H. Funabashi, K. Shimaoka, S. Sugiyama, "Anisotropic etching of silicon in TMAH Solutions", *Sensors and Actuators*, A34, 1992, pp. 51–57. (No month).

M. Motamedi, R. Anderson, R. de la Rosa, L. Hale, W. Gunning, R. Hall, M. Khoshnevisan, "Binary Optics thin film microlens array", *SPIE*, vol. 1751, Miniature and Micro–Optics, 1992, pp. 22–32. (No month).

M. Motamedi, H. Sankur, F. Durville, W. Southwell, R. Melendes, X. Wang, C. Liu, R. Rediker, M. Khoshnevisan, "Optical Transformer and Collimator for Efficient Fiber Coupling", *SPIE*, vol. 3008, San Jose, 1997. (No month).

*Primary Examiner*—James Phan
*Attorney, Agent, or Firm*—Koppel & Jacobs

[57] ABSTRACT

An integrated micro-electromechanical (MEM) optical resonator comprises a cantilever beam which is fixed to a substrate at one end and extends freely over the substrate at the other end, and a bimorph actuator stacked atop the beam at its fixed end. A reflective surface partially covers the top of the beam at its free end. The bimorph actuator comprises material layers having different thermal expansion coefficients. A DC-biased AC voltage connected across the actuator causes it to heat and cool as the current passing through it increases and decreases, creating a thermal bimorph effect which causes the cantilever beam and the reflective surface to oscillate in accordance with the varying current, preferably at the beam and actuator structure's fundamental resonant frequency. Combining the resonator with a light source and actuator excitation circuitry creates an optical scanner engine which delivers a scan angle in excess of 20 degrees and a scan rate of up to 2000 Hz, using a driving voltage of only 2 $V_{p-p}$.

31 Claims, 10 Drawing Sheets

MICRO-ELECTROMECHANICAL (MEM) OPTICAL RESONATOR AND METHOD

BACKGROUND OF THE INVENTION

1. Field of the Invention

This invention relates to the field of optical scanners, particularly those based on a micro-electromechanical (MEM) optical resonator.

2. Description of the Related Art

Optical scanning systems, i.e., systems which generate a scanning laser or light beam and detect the beam's reflection off of a target, find widespread use in such diverse fields as laser imaging, factory automation and information handling. Such a system typically includes a laser light source, an oscillating mirror, and a photodetector. The laser light is directed onto the oscillating mirror and the reflected beam traces a "scan line" each time the mirror moves from one oscillation extreme to the other. The scan line is in turn directed at a target such as a bar code, and laser light reflected from the target is detected by a photodetector which produces an output that provides information about the target. Two-dimensional (2-D) scanners, which can trace scan lines in two typically orthogonal directions, are also in common use.

A key component of an optical scanning system is the oscillating mirror. The frequency of oscillation determines the system's "scan rate", i.e., the number of times per second that a scan line is traced. A high scan rate enables a target to be scanned more quickly than it would be with a lower scan rate. The distance the mirror moves when oscillating determines the system's mechanical and optical "scan angles". Mechanical scan angle is defined as the angle between the plane of the mirror at one oscillation extreme and the other extreme. Optical scan angle is defined as the angle between a light beam reflected off the mirror at one oscillation extreme and the other extreme, which is equal to twice the mechanical scan angle. As used below, "scan angle" refers to the optical scan angle.

A high scan angle is critical to a scanning system's "resolution", i.e., the size of the smallest target detail which can be resolved by a scanning system. A system's resolution is determined by a variety of factors, including the quality of its light source, the optical components used, the scan angle and the distance from the light source to the target. If a target is far enough away from the source, even a system with a small scan angle produces a wide scan line which can trace a wide target. However, the spot size of a laser beam increases as it travels from its source, so that a large separation between source and target adversely affects resolution. A system having a wide scan angle offers the advantage of tracing a wide scan line while keeping the distance between source and target small, increasing system resolution.

Present optical scanners are generally based on galvanometric or oscillatory systems. A galvanometric scanner is a form of electric motor in which the armature is made to alternate between clockwise and counter-clockwise rotations of less than 360 degrees, typically producing a scan angle of less than 60 degrees. A plane mirror with its surface parallel to the axis of rotation is rigidly mounted on the projecting shaft of the armature. Galvanometric scanners tend to be bulky, heavy, expensive and have poor reliability. They are discussed in more detail in G. F. Marshall and J. Montagu, "Advances in Oscillatory Optical Scanners", SPIE Vol. 2383, pp. 440–448 (1995).

Oscillatory scanner systems operate by providing a stimulus necessary to cause a mirror and its mechanical mount to oscillate at the structure's mechanical resonance frequency, at which the system's scan angle is maximized. One such system, described in H. Goto and K. Imanaka, "Super compact dual axis optical scanning unit applying a torsional spring resonator driven by a piezoelectric actuator", SPIE Vol. 1544, Miniature and Micro-Optics: Fabrication and System Applications, pp. 272–280 (1991), uses a piezoelectric actuator attached to a resonator structure using an epoxy resin to excite the structure at its resonant frequency. The resonator structure includes mirror, torsional spring and inertia generating segments. This system has several shortcomings, however. The scan rate of the system is limited to about 288 Hz and the scan angle is limited to about 20 degrees. The piezoelectric actuator is bulky and requires a high driving voltage, and the device requires the separate manufacture and subsequent joining of the actuator and resonator components, resulting in a somewhat fragile hybrid device.

Another optical scanning system, described in U.S. Pat. No. 5,579,148 to Nishikawa et al., employs a resonator which includes four bimorph cells and three torsional springs surrounding a mirror. This multiplicity of components is hand-assembled into a bulky, complex, fragile structure which produces a scan angle of up to ±30 degrees, but requires a driving voltage of up to 20 $V_{p\text{-}p}$.

SUMMARY OF THE INVENTION

An integrated micro-electromechanical (MEM) optical resonator and method are presented which overcome the problems of the prior art devices discussed above, which is particularly well-suited for use in optical scanner engines and scanning systems.

The optical resonator is a monolithically integrated device having two main components: a bimorph actuator and a cantilever beam. The cantilever beam is fixed to a substrate at one end and extends freely over the substrate at the other end. The actuator is affixed to the top of the beam at the beam's fixed end, and a reflective surface partially covers the top of the beam at its free end.

The bimorph actuator is made from materials having different thermal expansion coefficients, which are formed in layers and stacked atop each other at the fixed end of the cantilever beam. An AC voltage connected across the actuator causes it to heat and cool as the current passing through it increases and decreases. The thermally mismatched layers create a "thermal bimorph effect" which causes the cantilever beam to which the actuator is firmly affixed to bend in accordance with the varying current, and thereby cause the reflective surface to oscillate at the frequency of the AC voltage across the actuator. The cantilever beam/actuator structure has several mechanical resonance modes, and the frequency of the AC voltage is chosen to coincide with one of them, with the greatest scan angle obtained when the resonator is excited at its fundamental resonant frequency.

The novel optical resonator structure provides an oscillating reflective surface which is suitable for use in an optical scanning system. When combined with a light source and actuator excitation circuitry, an optical scanner engine is provided which delivers a scan angle in excess of 20 degrees and a scan rate of up to 2000 Hz, using an actuator excitation voltage of only 2 $V_{p\text{-}p}$ (biased with 1 Vdc). Actuator excitation circuitry may be integrated on the same substrate as the resonator, or separately fabricated and connected to the resonator as a hybrid device. Variations on the basic resonator design add the capability of electronically controlling optical flatness and of creating a resonator which provides 2-D scanning. A novel refinement in the fabrication process provides a reflective surface which serves as a single-surface collimator, which improves scanner resolution while allowing the use of low-cost laser diodes and reducing the need for collimating and focusing optics.

The monolithically integrated actuator and cantilever beam provide a small, lightweight, low cost, robust optical resonator. Newly developed techniques described herein enable the fabrication of a reflective surface offering an optical flatness of at least $\lambda/4$, and of a cantilever beam having a thickness which is known with a high degree of precision and which has less residual stress, which also improves flatness.

Further features and advantages of the invention will be apparent to those skilled in the art from the following detailed description, taken together with the accompanying drawings.

DETAILED DESCRIPTION OF THE INVENTION

Figure 1:
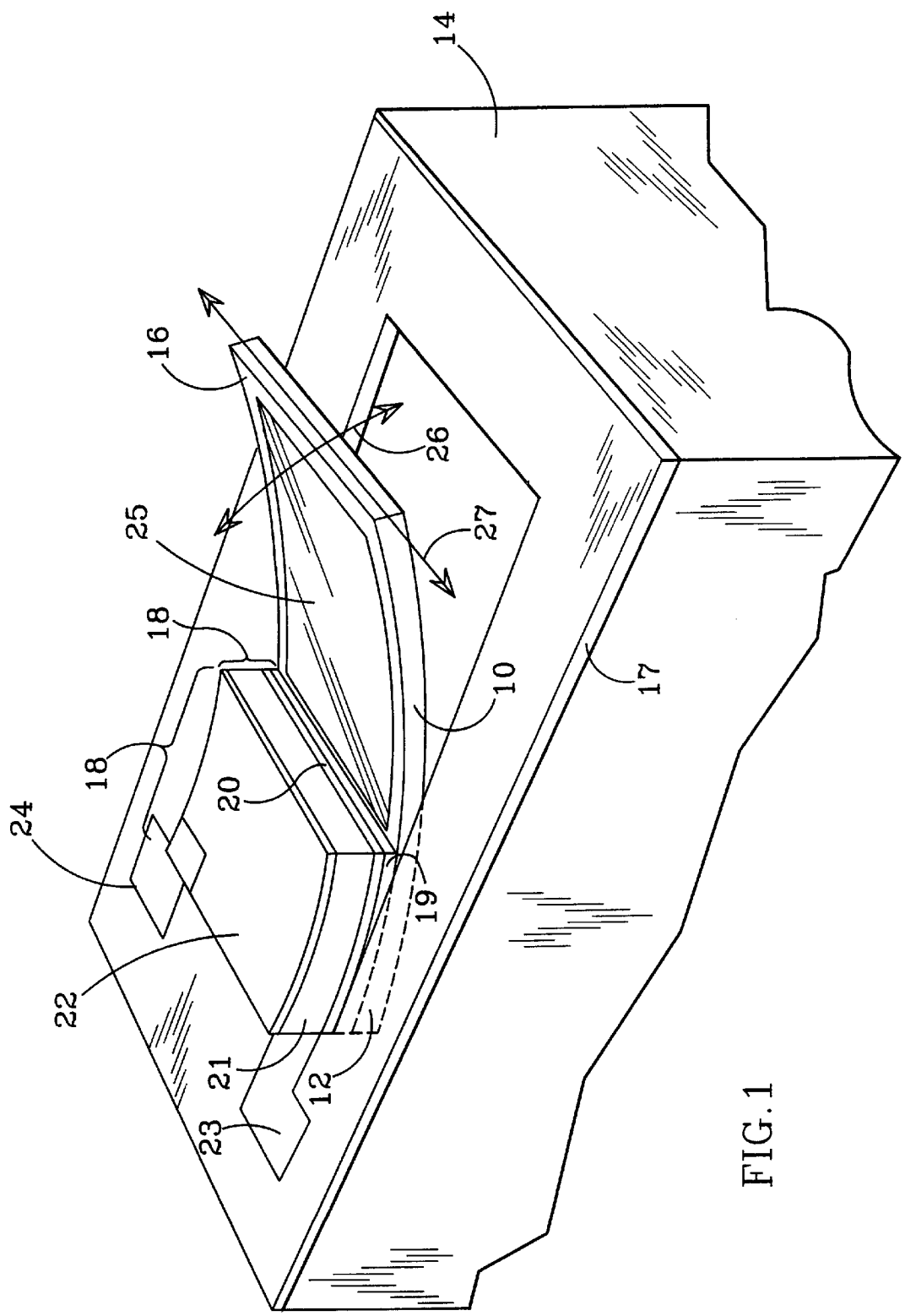
FIG. 1 is a perspective view of an optical resonator per the present invention.

An integrated, low-power, low-cost, robust optical resonator is shown in FIG. 1. A cantilever beam 10 is affixed at one end 12 to a substrate 14, and extends freely over the substrate at a second end 16. An insulating layer 17, preferably silicon dioxide ($SiO_2$), is on the substrate 14, and a bimorph actuator 18 is atop the insulating layer 17 at the beam's fixed end 12. Bimorph actuators in general are made from at least two stacked layers of material, with each layer having unique structural or electrical properties. The different properties result in a stress distribution through the actuator that is discontinuous with depth. Modulating the stress level in the actuator changes both 1) the longitudinal tension or compression, and 2) the bending moment in the beam cross section. This causes one end of the actuator to 1) move longitudinally (with respect to an opposite end) to relieve the longitudinal stress, and 2) move in the depth direction (with respect to an opposite end) to relieve the bending stresses. The motion due to bending is the principal actuator action utilized by the present invention.

The bimorph actuator 18 used in the present invention comprises material layers which have different thermal expansion coefficients. Forcing the actuator's temperature to rise and fall causes the layers to expand and contract accordingly, creating a "thermal bimorph effect". The actuator 18 is positioned over the beam's fixed end 12, and the beam is made to bend via the thermal bimorph effect.

The bimorph actuator 18 includes all of the material layers which are stacked atop each other at the fixed end of the beam 10, including the beam itself 10, a portion 19 of insulating layer 17, a metal layer 20 on the $SiO_2$, a bimorph material layer 21, and a second metal layer 22 atop the bimorph material. All the layers contribute to the thermal bimorph effect described above, but the biggest contributors are metal layer 22 and bimorph layer 21. (Metal layer 20, positioned near the neutral axis of the actuator structure, contributes very little to the bimorph effect.) The thermal expansion coefficient of metal is higher than that for most bimorph materials, so placing the quicker-expanding metal layer 22 atop the bimorph layer 21 causes the beam to be forced to bend downward when the actuator is heated.

The beam 10 occupies a static "rest position" when actuator 18 is not subjected to any forced heating. The temperature of actuator 18 is made to rise and fall by causing an electrical current to flow through its layers; increasing the current heats the actuator and causes the beam 10 to bend down and away from its rest position, and reducing the current allows the actuator to cool and return towards its rest position. Metal layers 20 and 22 serve as bottom and top electrodes, respectively, through which current is made to flow through the bimorph material 21. Connection pads 23 and 24 connected to electrodes 20 and 22, respectively, are preferably provided on insulating layer 17, to facilitate the application of a current flow inducing voltage across electrodes 20 and 22. When an AC voltage is applied across the electrodes, actuator 18 heats and cools at the frequency of the AC voltage, causing the cantilever beam's free end 16 to move up and down at the same frequency. The voltage applied across electrodes 20 and 22 is referred to herein as the "actuator excitation voltage".

A reflective surface 25 covers a portion of the cantilever beam 10 at its free end 16. The movement of the reflective surface in accordance with the excitation of actuator 18 creates an optical resonator.

The substrate 14 and cantilever beam 10 are preferably made from single crystal silicon, which provides a higher yield, easier handling and higher reliability than other substrate materials which could be used, such as gallium arsenide. The use of silicon also enables the integration of actuator excitation circuitry, including CMOS or bipolar components, for example, on the same substrate with the resonator.

The bimorph material 21 serving as part of bimorph actuator 18 is required to heat up in response to a current flowing through it. Zinc oxide (ZnO) or polysilicon are preferred bimorph materials, though other materials having a resistivity on the order of $10^3$–$10^4$ $\Omega$-cm are acceptable. The electrodes 20 and 22 are preferably gold with a thin titanium film as an adhesion layer, which provides excellent electrical conductivity and contributes to the thermal bimorph effect of the bimorph actuator 18.

The reflective surface 25 may be simply the silicon surface of the cantilever beam, which provides a reflectivity of about 30%. However, the reflective surface is preferably a mirror, achieved by depositing a layer of gold in the reflective surface area, which increases reflectivity to about 90% and can be deposited simultaneously with the top electrode 22. (Fabrication of the optical resonator is discussed in detail below). A layer of aluminum also provides excellent reflectivity, but would require an additional masking step not needed with gold.

The actuator heats and cools as the current flowing between electrodes 20 and 22 increases and decreases, respectively. The preferred actuator excitation voltage, therefore, is an AC voltage which is DC biased to prevent it from passing through zero. In practice, a DC bias of about 1 volt is applied across the actuator (top electrode 22 positive with respect to the bottom electrode 20), heating the actuator and causing the beam to bend downward and occupy a "center position", and an AC voltage of about 2 $V_{p-p}$ causes the beam to oscillate approximately equally about the center position.

The amount by which the cantilever beam's free end 16 moves, i.e., its "excursion" distance, is affected by the magnitude and frequency of the actuator excitation voltage. As a mechanical structure, the resonator has several resonant frequencies (dependent on factors such as beam thickness and length, number and thickness of the actuator layers, and the properties of the cantilever and actuator materials), including a fundamental resonant frequency $f_0$. For a given actuator excitation voltage, the beam's excursion distance is greatest when the excitation frequency is equal to $f_0$. The scan angle of the reflective surface 25 is directly related to excursion distance, and is also greatest at $f_0$.

An actual resonator built per the present invention provided a scan angle (with a light source directed at the reflective surface 25) of about 25 degrees when excited with a sinusoidal AC voltage of about 2 $V_{p-p}$ biased with about 1 Vdc, and having a frequency about equal to the resonator's fundamental resonant frequency $f_0$ of about 140 Hz.

When the resonator is excited at its fundamental resonant frequency $f_0$, it causes the beam to move up and down with respect to the substrate, with the resultant scan angle referred to as the "vertical" scan angle 26. As a mechanical structure, however, the resonator has a number of additional resonance modes. It has been observed that at least one of these additional resonant frequencies, $f_{lat}$, induces the beam to oscillate in a direction orthogonal to the fundamental mode, creating a "lateral" scan angle 27. This characteristic is exploited to create a two-dimensional (2-D) resonator. Two AC voltages, one oscillating at $f_0$, and one at $f_{lat}$, are time-multiplexed onto the connection pads 23 and 24 to produce resonator movement in two dimensions. When a light source is directed onto the resonator's reflective surface 25 (as discussed below), a 2-D scanning beam is produced. One optical resonator produced a vertical scan angle of about 16 degrees when excited at its $f_0$ frequency of about 210 Hz, and a lateral scan angle of about 15 degrees when excited at its flat frequency of about 700 Hz. Typically, however, lateral scan angle has been demonstrated to be about ¼ that of the vertical scan angle. The resonant frequencies of a given cantilever beam are preferably determined empirically, by slowly sweeping the frequency of the actuator excitation voltage and observing the resulting scan angles.

An alternative technique for exciting a 2-D resonator uses a frequency modulated actuator excitation voltage, with the lower resonant frequency fo modulating a carrier signal which is at the higher resonant frequency $f_{lat}$.

The cantilever beam depicted in FIG. 1 is intended as merely illustrative. For example, reflective surface 25 is preferably flatter than shown (achievable per the fabrication method described below), and the arrangement of electrodes around the bimorph actuator(s) can differ from that shown.

Figure 2A:
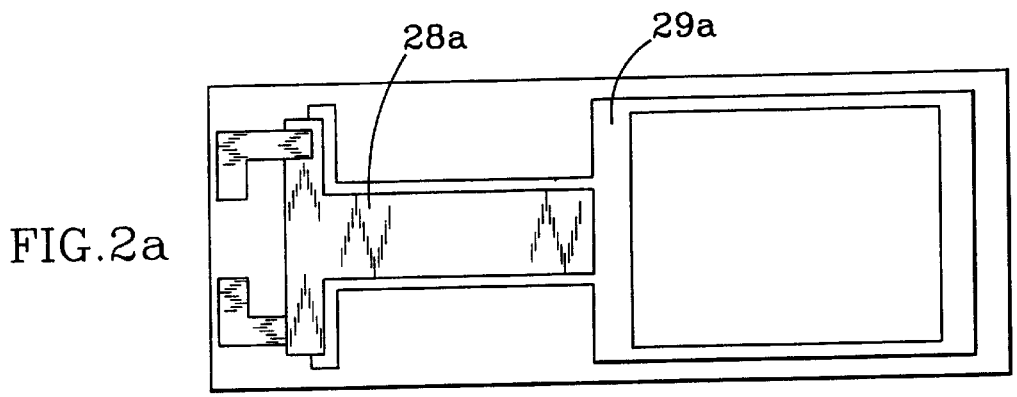
FIGS. 2a, 2b and 2c are plan views of three bimorph actuator/cantilever beam/reflective surface configurations for an optical resonator per the present invention.
Figure 2B:
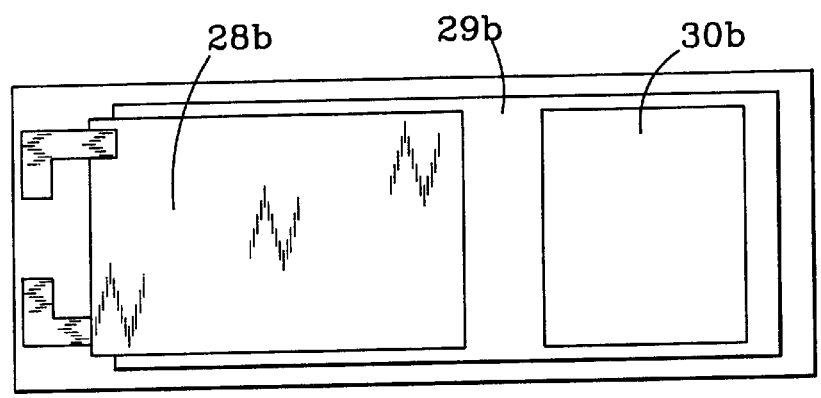
Figure 2C:
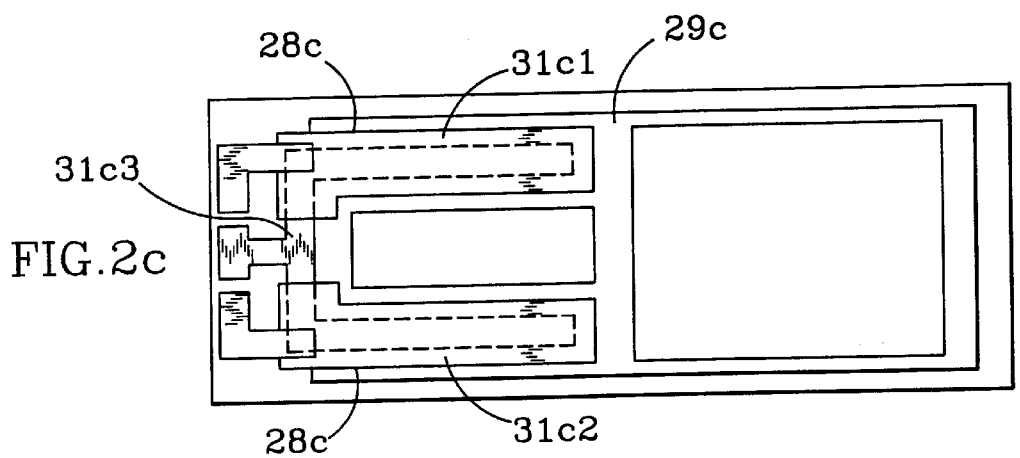

The shape of the bimorph actuator's footprint on the cantilever beam 10, and the shape of the beam itself, affects the performance of the resonator. Plan views of three alternative actuator/beam shapes are shown in FIGS. 2a–2c. In FIG. 2a, an actuator 28a with a narrow width is used, which gives the beam 29a to which it is attached, which is also narrowed in the area beneath the actuator, more freedom to oscillate in a lateral or torsional mode, as is necessary for 2-D scanning. In FIG. 2b, a larger actuator 28b is combined with a smaller reflective surface 30b to increase the obtainable vertical scan angle. In FIG. 2c, a U-shaped actuator 28c is split into two fingers which are positioned along respective edges of the cantilever beam 29c, which features a hollowed-out area between the fingers. Three electrodes are used, with electrodes $31c_1$ and $31c_2$ on top of respective fingers, and one electrode $31c_3$ providing a common ground beneath the fingers. Because the fingers hold the beam 29c by its edges, warping in the beam due to residual stress is reduced. A common actuation voltage is preferably applied across $31c_1/31c_3$ and $31c_2/31c_3$.

Figure 3:
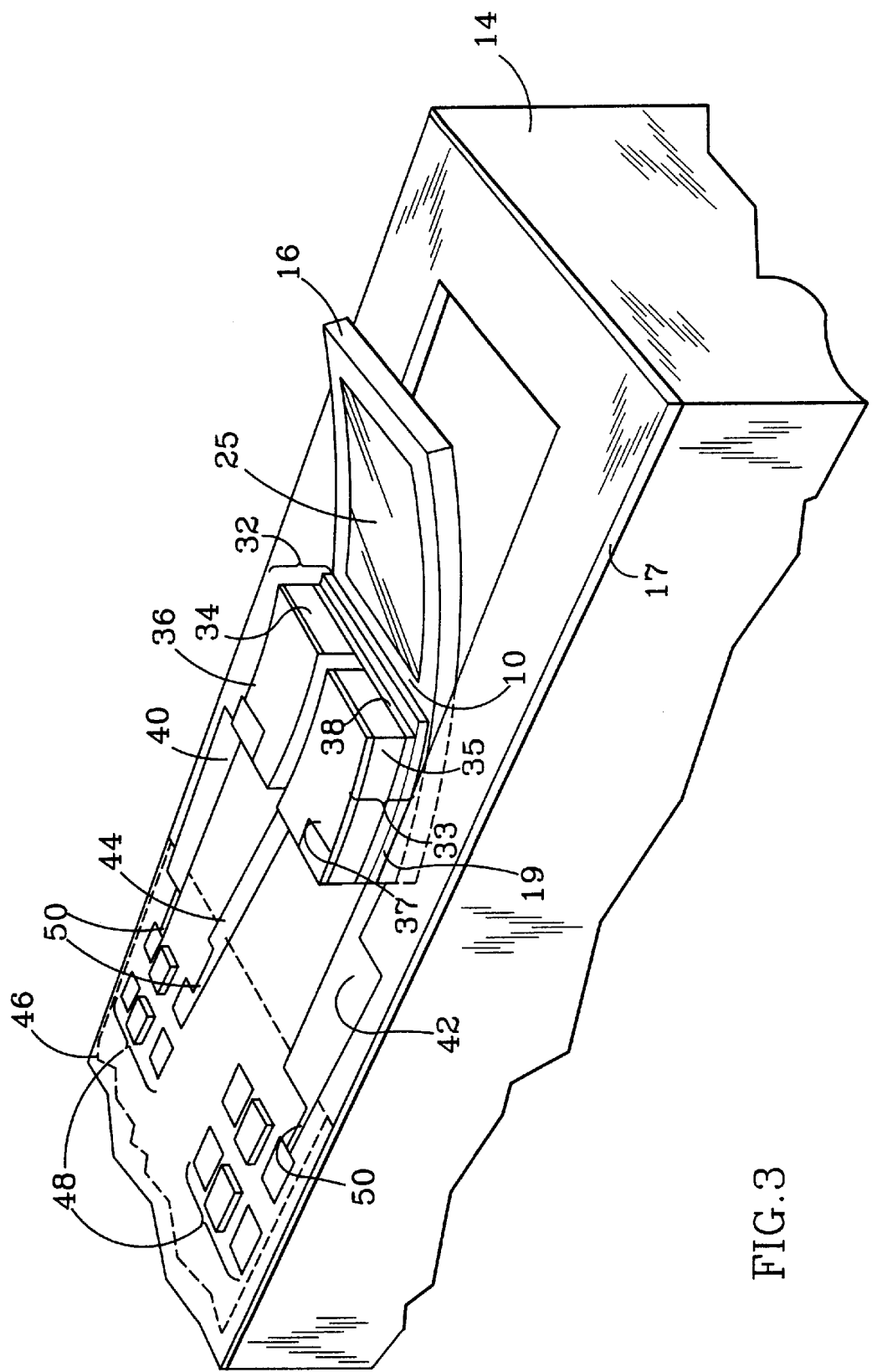
FIG. 3 is a perspective view of a two-actuator embodiment of an optical resonator per the present invention, further showing the integration of actuator excitation circuitry on the same substrate as the resonator.

An alternate two-actuator embodiment of an optical resonator per the present invention is shown in FIG. 3. Two independent bimorph actuators 32 and 33 are positioned side by side atop the portion 19 of insulting layer 17 over the fixed end of cantilever beam 10. The actuators include respective bimorph material layers 34 and 35 sandwiched between respective electrodes 36 and 37 on the top, and a common ground electrode 38 on the bottom, with the three electrodes electrically isolated from each other. Connection pads 40, 42, and 44 extend from the actuators and make electrical contact with electrodes 36, 37 and 38, respectively. When both actuators 32 and 33 are excited with the same AC voltage, the resonator performs similarly to the one-actuator configuration of FIG. 1. However, when the two driving voltages—particularly the respective DC bias voltages—are unequal, a twist is induced into beam 10, which can be used to enhance the optical flatness of the reflective surface 25, or to enhance the optical performance of a lensed reflective surface (discussed below). The resonant frequencies of each beam/actuator structure will be nearly equal, and both actuators are preferably driven with a single frequency; inequalities due to small differences in resonant frequency are preferably compensated for by adjusting the DC biases of the respective actuator excitation voltages.

The three-terminal/two-actuator resonator implementation shown in FIG. 3 has been used to provide 2-D scanning, but the lateral scan angle obtainable with this twisting technique has been unacceptably low, typically less than 5 degrees. The two-frequency time or frequency multiplexed actuator excitation voltage scheme discussed above is preferred for 2-D operation.

A major advantage is presented by the invention by virtue of its preferred implementation on a silicon substrate. This allows other circuitry, such as the actuator excitation circuitry needed to drive the bimorph actuator(s), to be integrated on the same substrate, as is illustrated in FIG. 3. Actuator excitation circuitry 46, comprising a number of integrated active devices 48 for example, is interconnected with the optical resonator via metallization traces 50 running between the circuitry 46 and the connection pads 40, 42 and 44 of actuators 32 and 33. The active devices shown are intended as merely illustrative; metallization traces which would typically interconnect the active devices are not shown.

Other advantages are inherently present in the integrated optical resonator, including very small size, very low-cost, and light weight. High reliability is expected due to the very low mass of the components, and has been empirically established by cycling the beam of one resonator in excess of 5 billion times without failure or any noticeable degradation of performance.

Figure 4:
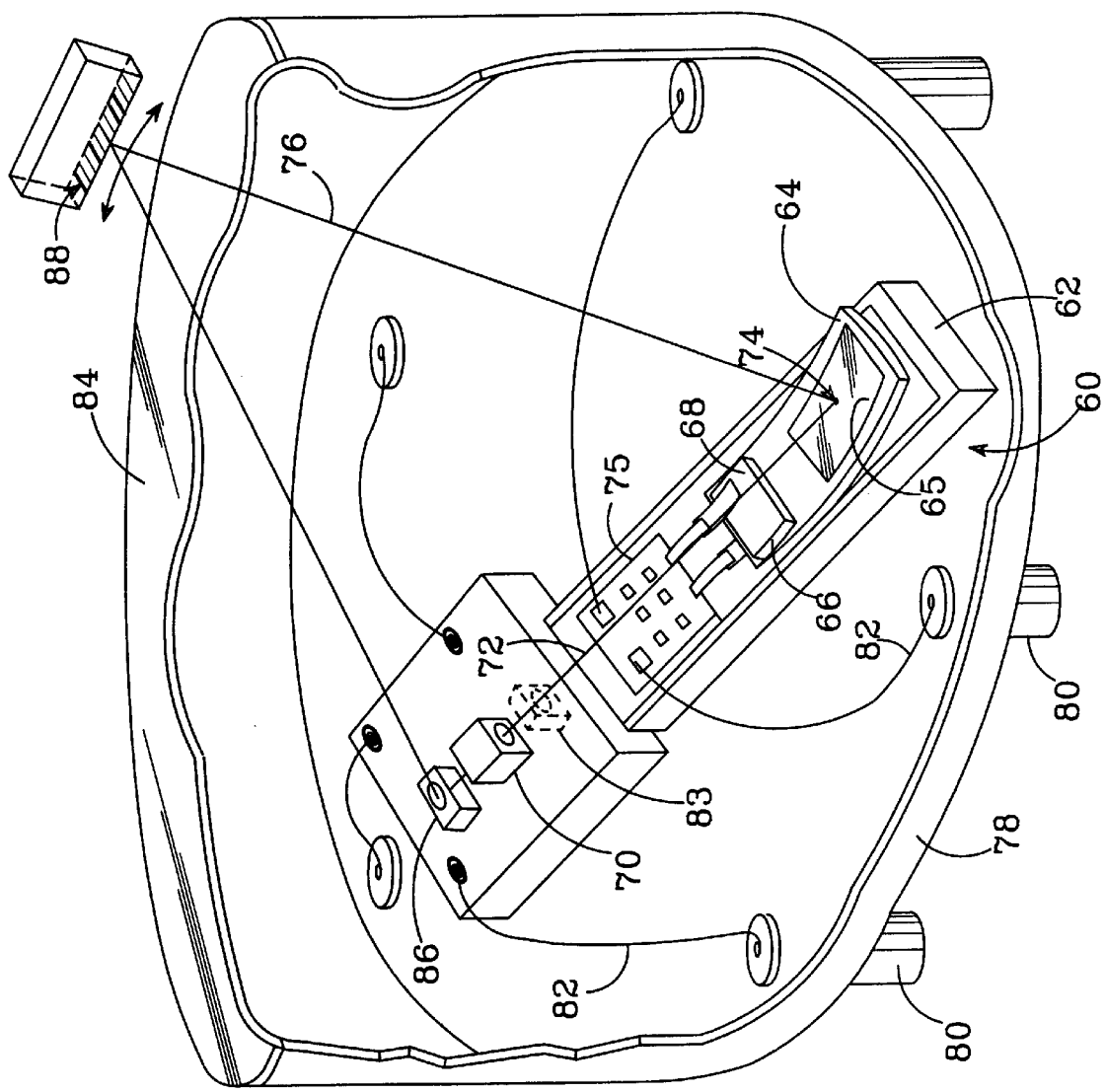
FIG. 4 is a perspective view of an optical scanner engine and scanning system incorporating the present optical resonator.

An optical scanner engine using the present optical resonator is shown in FIG. 4. An optical resonator 60, including a substrate 62, cantilever beam 64 with reflective surface 65, bimorph actuator 66 including actuator electrodes 68, and a light source 70 are arranged such that the output 72 generated by the light source impinges on the reflective surface 65 of the cantilever beam. The source's output 72 is preferably directed to strike near the midpoint 74 of the reflective surface 65 when the surface is at its center position, to increase the scan angle over which the light 72 is reflected. Actuator excitation circuitry 75 for driving actuator 66 is integrated with the resonator 60 on substrate 62. The resonator 60, light source 70 and circuitry 75 form an optical scanner engine, generating a scanning light beam 76 when activated.

The scanner engine's components are preferably contained within a housing 78 (shown with the wall cut-away to reveal the engine components), which preferably includes means for conveying external signals to the engine components, via connector pins 80 and wire bonds 82, for example. External signals necessary for the scanner engine's operation may include one or more power supply voltages, for example. Actuator excitation circuitry 75 may alternatively be placed on a separate die from the resonator 60 (though still within the housing 78), or even be external to the housing and connected to the actuator via the connection pins.

Because the resonator's reflective surface functions regardless of the wavelength of incoming light, the invention operates with any type of light source. Light source 70 is preferably a circular collimated laser diode, to reduce aberrations caused by cylindrical lenses found in many common laser diodes. Alternatively, collimating and focusing optics 83 may be placed between the source 70 and the reflective surface 65. Another alternative (discussed below) is the fabrication of a single-surface collimator in the area of the reflective surface 65, which provides a well-collimated output beam using a simple laser diode as light source 70.

The housing preferably includes an optical window 84, through which the scanning light beam 76 exits. All of the components described above can fit within a common TO-8 housing, providing a convenient, rugged, reliable optical scanner engine.

The addition of a photodetector 86 to the optical scanner engine creates an optical scanning system. Photodetector 86 receives light from scanning light beam 76 which reflects off of a target 88, such as a barcode, and back through optical window 84. The photodetector 86 produces an output which varies in accordance with the light received, which is sent to additional circuitry (not shown) for processing.

FABRICATION

Figure 5A:
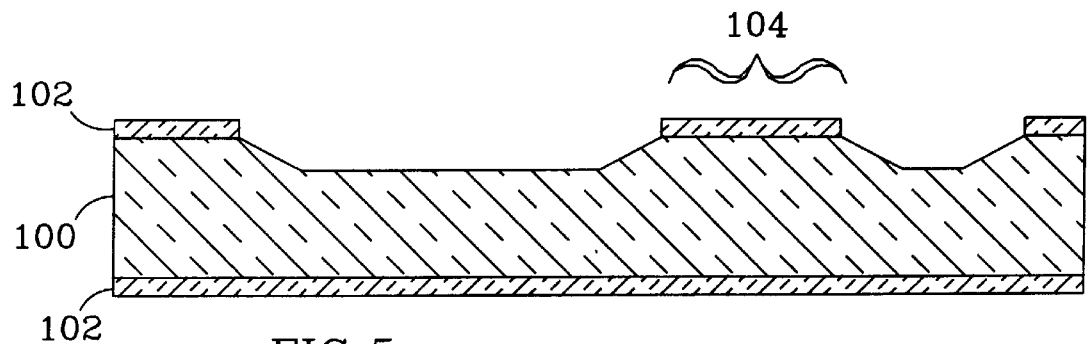
FIGS. 5a–5g are sectional views illustrating a process sequence for fabricating the present optical resonator.
Figure 5B:
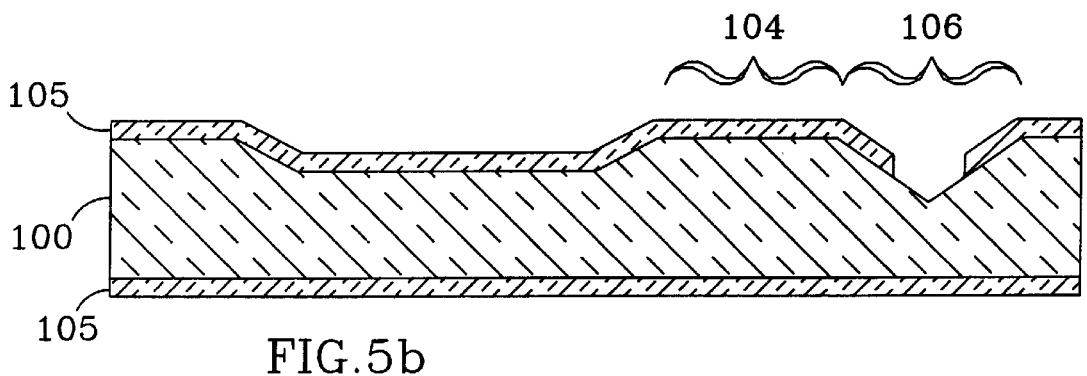
Figure 5C:
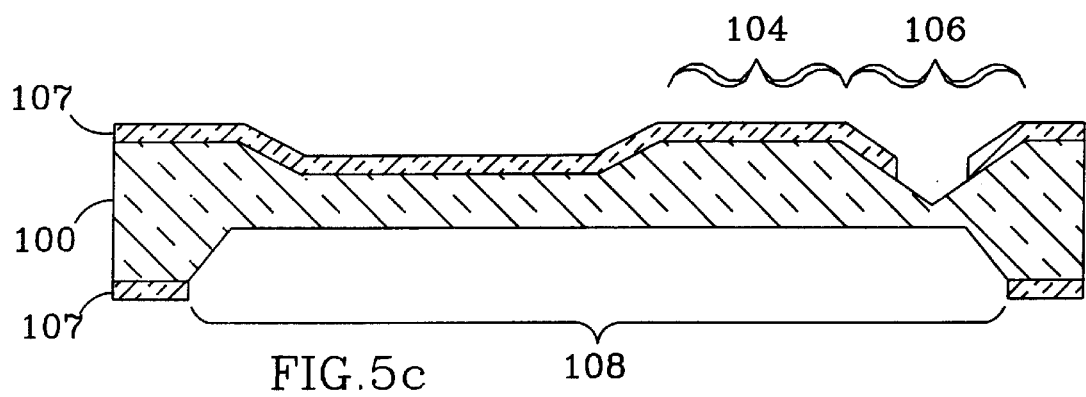

An optical resonator as described herein may be fabricated using a double-sided bulk micromachining process with six mask levels. Sectional views of one possible process sequence are shown in FIGS. 5a–5g. A substrate 100 is covered on top and bottom with a grown layer of $SiO_2$ 102. The first mask level defines a mesa area 104, the top of which will become the reflective surface of the resonator; etching is done using a 25% tetra-methyl-ammonium-hydroxide (TMAH) solution, resulting in the structure shown in FIG. 5a. Oxide layer 102 is stripped and a new oxide layer 105 is grown. The second mask level features a cut-through pattern which, when etched, creates a channel 106 which establishes the length, width and thickness of the cantilever beam; etching is accomplished with the TMAH solution and results in the structure shown in FIG. 5b. A corner protection scheme is used to preserve the integrity of the mesa 104 and beam (ref. no. 116 in FIG. 5g) structures. One such scheme locates extra tabs of silicon on critical corners; then, rather than damaging the corners during subsequent etching steps, the tabs are etched away in the course of processing the device. Oxide layer 105 is stripped and a new oxide layer 107 is grown. The third mask level defines the backside area 108, which is etched with TMAH until the desired scanner beam thickness is nearly, but not completely, obtained. As shown in FIG. 5c, a small amount of silicon should be left between the bottom of the cut-through channel 106 and the backside 108, to be etched later. TMAH etching is described in detail in O. Tabata, R. Asahi, H. Funabaski, K. Shimaoka, and S. Sugiyama, "Anisotropic etching of silicon in TMAH solutions," *Sensors and Actuators*, A34 (1992), pp. 51–7. Front-to-backside alignment is done using a 1x contact aligner with an infrared-red/visible light source. The alignment marks for backside alignment are patterned on the front side with a regular lift-off process using aluminum. After the backside oxide is patterned, the aluminum is stripped off using an HCl solution.

Figure 5D:
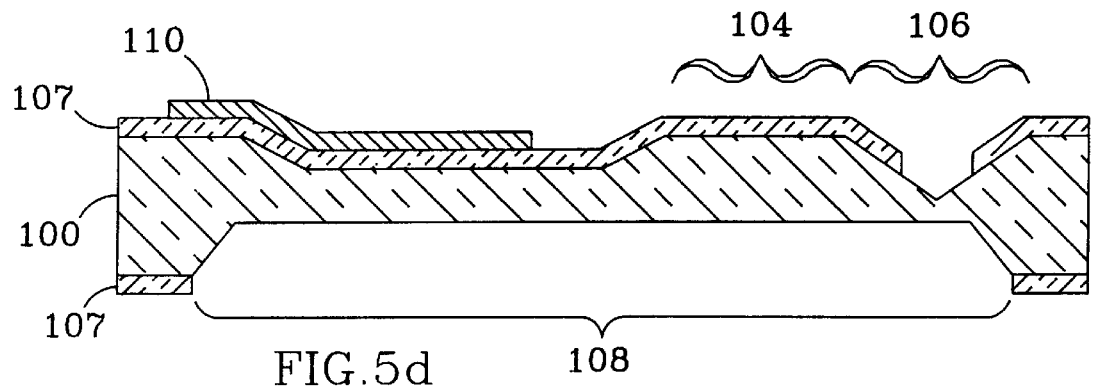
Figure 5E:
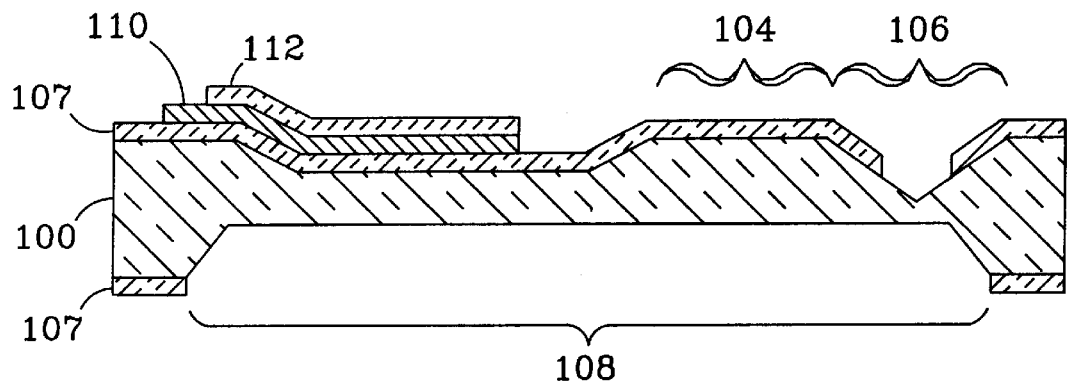
Figure 5F:
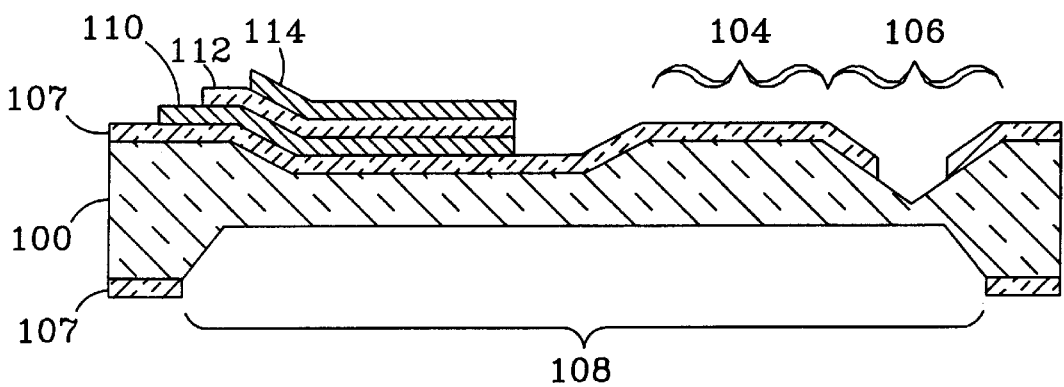

The fourth mask level defines a bottom electrode 110 on the top side of the substrate 100 which is electrically isolated from the substrate surface with $SiO_2$ layer 107; the electrode is defined by depositing a layer of titanium/gold (gold with a thin (~200 Å) film of titanium to adhere the gold to the substrate) via evaporation and is shown in FIG. 5d. The fifth mask level forms the bimorph material layer 112 in FIG. 5e, which is deposited by sputtering a layer of a bimorph material such as zinc oxide on top of bottom electrode 110. As shown in FIG. 5f, the sixth mask level defines the top electrode 114, formed by the same method as the bottom electrode 110, with the evaporation done by rotation to get good step coverage over the bimorph material and bottom electrode layers. The patterning for both top and bottom electrodes is preferably done using an image-reversal liftoff process using 20 µm thick photoresist, as described in M. E. Motamedi, R. J. Anderson, R. de la Rosa, L. G. Hale, W. J. Gunning, R. L. Hall and M. Khoshnevisan, "Binary optics thin film microlens array", SPIE Vol. 1751, Miniature and Micro-Optics, pp. 22–32 (1992).

The top of the mesa structure 104 serves as the resonator's reflective surface. The sixth mask level and top electrode deposition can also be used to place a layer of titanium/gold atop the mesa structure 104, to increase its reflectivity. Other metals may alternatively be deposited atop the mesa structure, but require an additional masking and deposition step if different from the metal of top electrode 114.

Figure 5G:
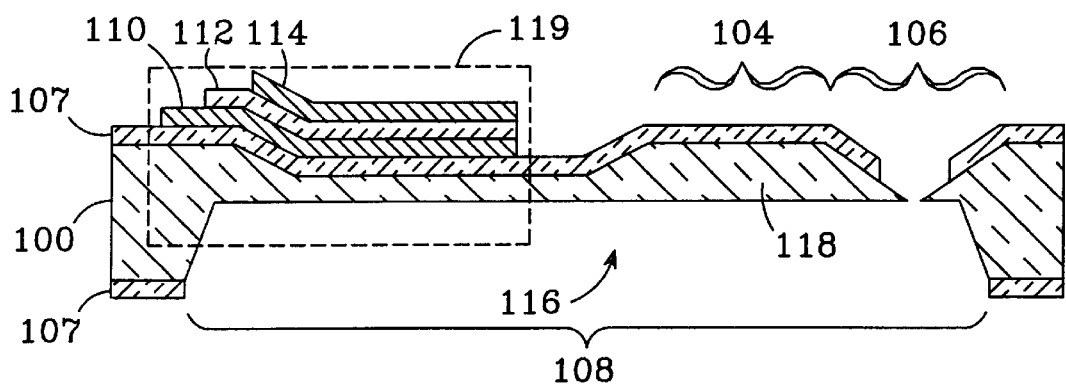

With the topside process steps complete, the silicon remaining between the bottom of the cut-through channel 106 and the backside 108 is etched away by reactive ion etching (RIE) using $X_2F_2$ (preferred because it is a highly selective etchant) or $SF_6$ gas etchant, forming a cantilever beam 116 having one end 118 which is free to bend (FIG. 5g). Stacked layers 107, 110, 112, 114, along with the portion of beam 116 below them, form a bimorph actuator 119.

There is typically some residual stress in the beam 116 as a result of the fabrication process, so that the beam rarely remains flat when its end 118 is freed. Instead, the beam usually bends upward. An upward bend upon freeing is preferred, as a downward bend may increase beam stress and thereby reduce its reliability.

The mesa structure 104 provides for a beam area that is thicker, and therefore stiffer, than the rest of the beam. This additional stiffness allows the attainment of an optical flatness for the reflective surface atop the mesa of at least $\lambda/4$ (assuming a $\lambda$ of about 0.6–0.7 $\mu$, as produced by a typical laser diode). One functional optical resonator has been fabricated with beam dimensions of about 6.8 mm in length, about 3.4 mm in width, and about 10 $\mu$m in thickness—except in the mesa area, which is about 15 $\mu$m thick. The bimorph actuator covers slightly less than half of the beam area, with the rest of the beam area (at its free end), about 12 mm$^2$, dedicated for the reflective surface. For some applications, it may be necessary to add a layer of metal or a stack of dielectric layers in the reflective surface area to meet a particular optical efficiency specification.

A trade-off is necessary when specifying the parameters of reflective surface area and beam thickness. A large reflective surface area (and mesa structure) requires additional beam thickness, adding stiffness which reduces the possible scan angle; conversely, a thinner, more pliant beam has a smaller area which is sufficiently flat to serve as a reflective surface.

Figure 6A:
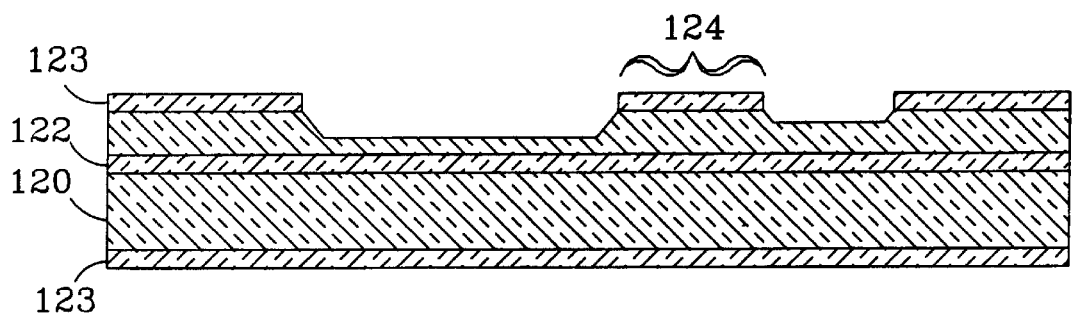
FIGS. 6a–6h are sectional views illustrating the preferred process sequence for fabricating the present optical resonator.
Figure 6B:
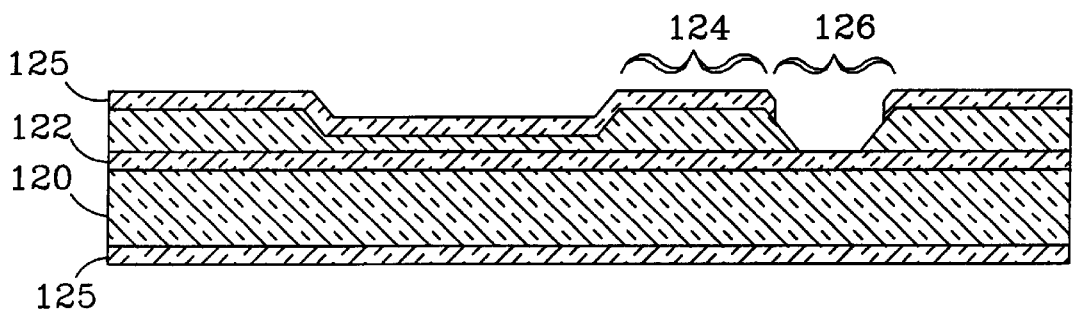
Figure 6C:
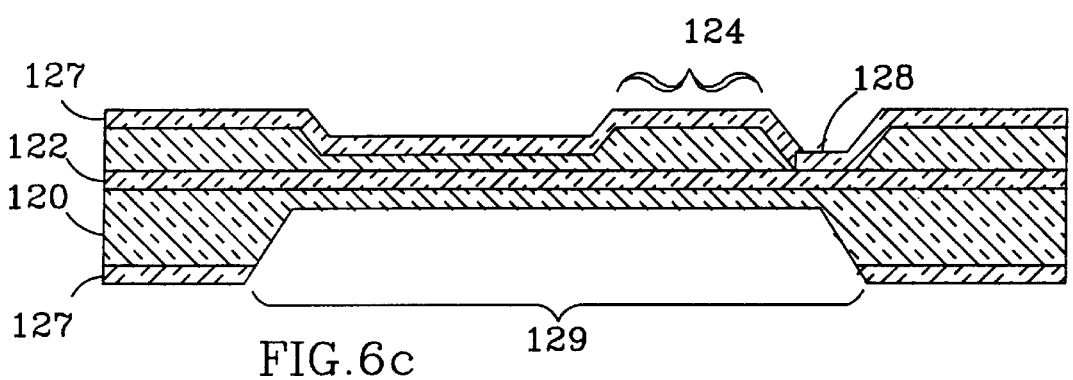
Figure 6D:
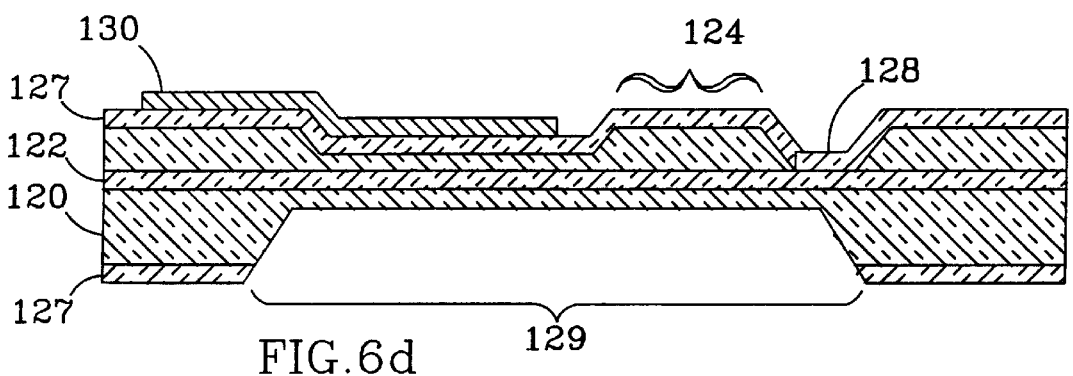
Figure 6E:
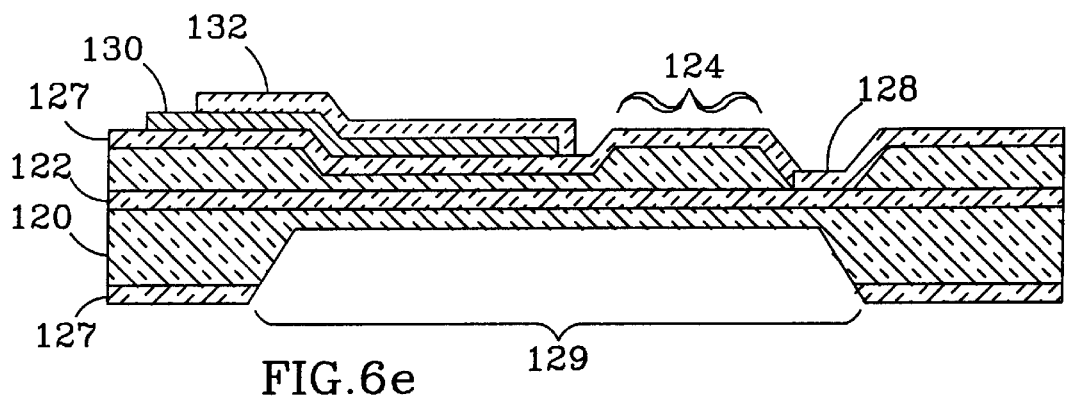
Figure 6F:
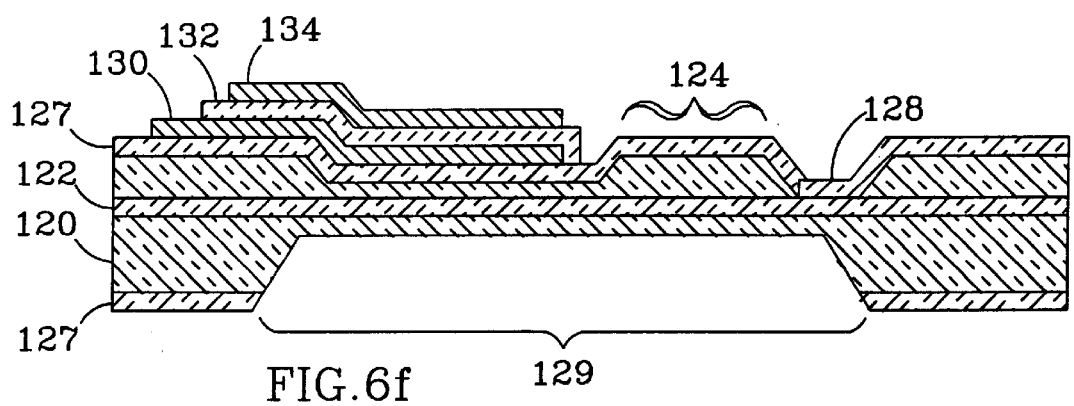
Figure 6G:
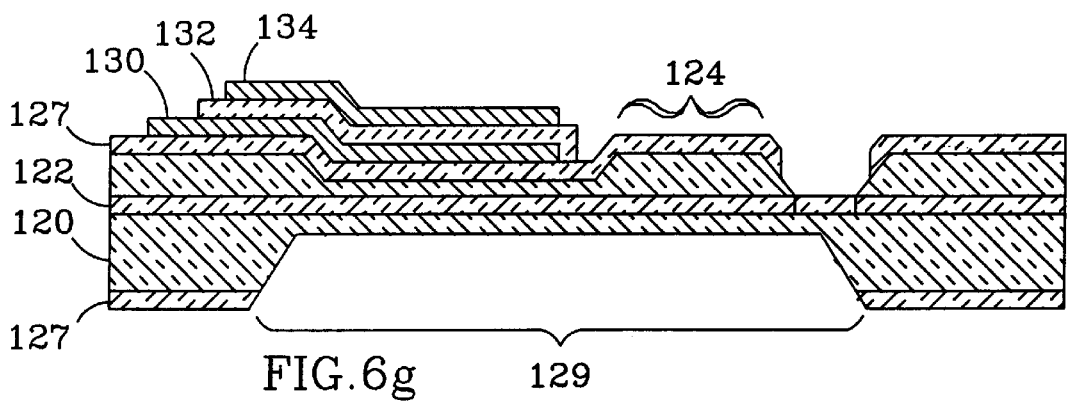

A preferred and novel fabrication process sequence is illustrated in the sectional views shown in FIGS. 6a–6h. As shown in FIG. 6a, a substrate 120 is procured which has an oxide layer 122 embedded within it at a specified depth, known as a "silicon-on-insulator" (SOI) wafer. Such a substrate is obtained by either implanting an oxide layer through the substrate, or by starting with two wafers, growing an oxide layer on one of the wafers and bonding it to the other wafer with the oxide in between, and then polishing the top wafer to a desired thickness. SOI wafers can be obtained from MEMC Electronic Materials Co. in St. Peters, Mo., for example. As with the process steps discussed above, an SiO$_2$ layer 123 is first grown on top and bottom of the substrate. A first mask establishes a mesa structure 124 (FIG. 6a) and a second mask defines a cut-through channel 126 (FIG. 6b), both etched using TMAH. Oxide layer 123 is stripped and a new oxide layer 125 is grown between the first and second mask steps. After the second mask step, oxide layer 125 is stripped and an new oxide layer 127 is grown, a portion 128 of which covers the bottom of the cut-through channel to protect it during subsequent processing steps. In FIG. 6c, the backside 129 is masked and etched with TMAH, removing most, but not all, of the silicon beneath the oxide layer. Masks 4, 5 and 6 in FIGS. 6d, 6e and 6f, respectively, define and deposit the bottom electrode 130, bimorph material layer 132 and top electrode 134, as before. The masking and deposition which define the top electrode can also be used to place a layer of titanium/gold atop the reflective surface 124, to increase its reflectivity. In FIG. 6g, the protective oxide layer 128 at the bottom of the cut-through channel has been removed in preparation for freeing the beam.

Figure 6H:
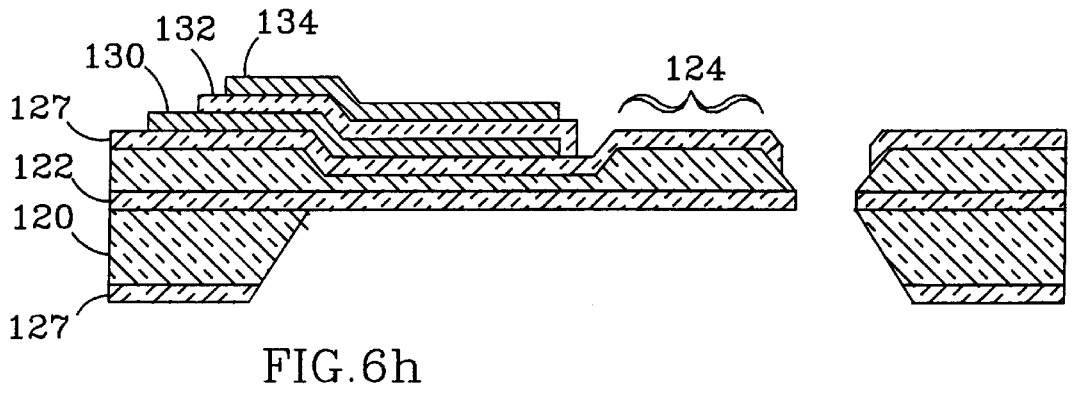

In FIG. 6h, the remaining thickness of silicon on the backside 129 is etched away by RIE using X$_2$F$_2$ (preferred because it is a highly selective etchant) or SF$_6$ gas etchant, which removes silicon precisely up to the embedded SiO$_2$ layer 122 and no further, freeing the end of the beam. In this way, the cantilever beam has a precisely known thickness, with the result that the parameters of stiffness, resonant frequency and useful reflective surface area are made much more predictable, and may be easily controlled by simply specifying the depth of embedded oxide layer 122.

Another significant advantage attributable to the use of an SOI wafer when fabricating a cantilever beam is an improved optical flatness. The symmetrical oxide layers on either side of the beam lower the beam's residual stress, so that less bending occurs when the beam is freed.

The fabrication of actuator excitation circuitry on the same substrate as the optical resonator of FIGS. 5 or 6 is preferably performed prior to the process steps needed to form the resonator. The circuitry should be passivated while the resonator's process steps are carried out, with the circuitry's contacts exposed upon completion of the resonator.

The actuator excitation circuitry may also be fabricated on a separate die and then interconnected to the resonator via wire bonds, for example. This hybrid approach has the advantage of simplifying the respective fabrication processes needed for the circuitry and the resonator, but has the drawback of introducing wire bonds which typically degrade circuit performance.

Figure 7A:
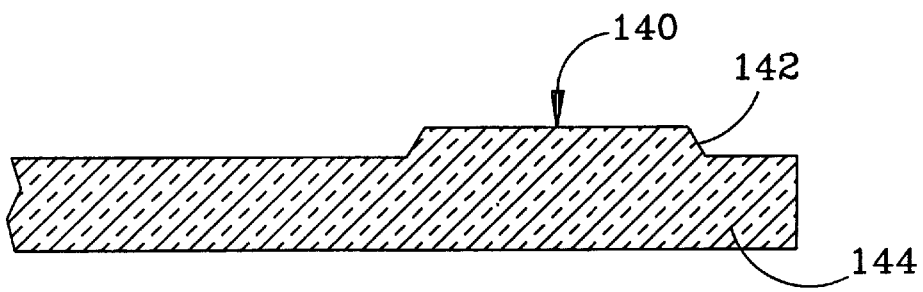
FIGS. 7a–7d are fragmentary sectional views illustrating a process sequence for fabricating a single-surface collimator on the present optical resonator.
Figure 7B:
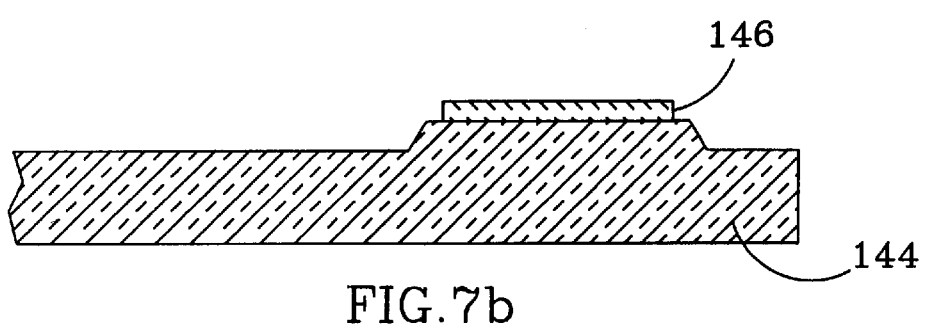
Figure 7C:
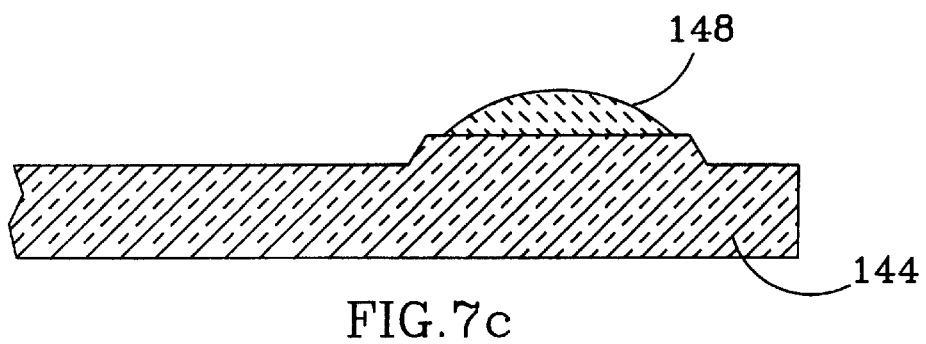
Figure 7D:
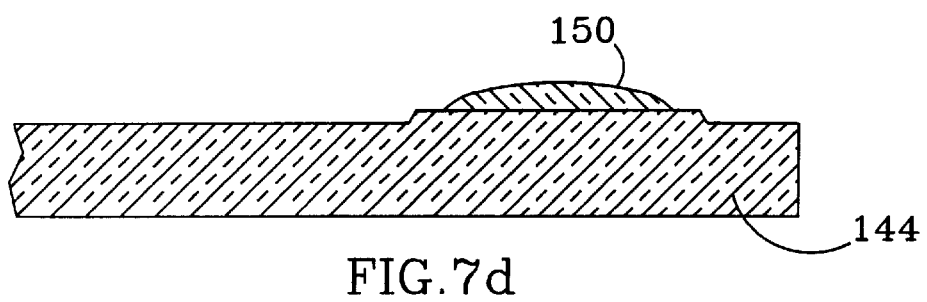

A process sequence may be performed, preferably after the first mask step of FIGS. 5 or 6 is performed, which places a single-surface collimator atop the mesa structure of the cantilever beam, providing a lensed reflective surface which reduces the need for collimating and focusing optics between a laser diode light source and the resonator. This sequence is illustrated in the fragmented sectional views of FIGS. 7a–7d. In FIG. 7a, a mesa structure 142 has been formed at the free end of cantilever beam 144. In FIG. 7b, a column of photoresist 146 is deposited on the mesa structure. The beam 144 is placed in a furnace and the photoresist melted, leaving a spherically-shaped mound of photoresist 148 atop the mesa 142. The mesa structure 142 and photoresist 148 are then RIE etched, removing the photoresist and some thickness of silicon at the top of the mesa, leaving a mound of silicon 150 atop the mesa. Because a spherical lens can cause aberrations, the RIE is specifically performed to insure that the remaining mound of silicon 150 is aspheric. When properly etched, the remaining silicon 150 functions as a single-surface collimator. Details of this process are described in M. E. Motamedi, H. O. Sankur, F. Durville, W. H. Southwell, R. Melendes, X. Wang, C. Liu, R. Rediker and M. Khoshnevisan, "Optical Transformer and Collimator for Efficient Fiber Coupling", SPIE San Jose '97, Vol. 3008 (1997).

Figure 8:
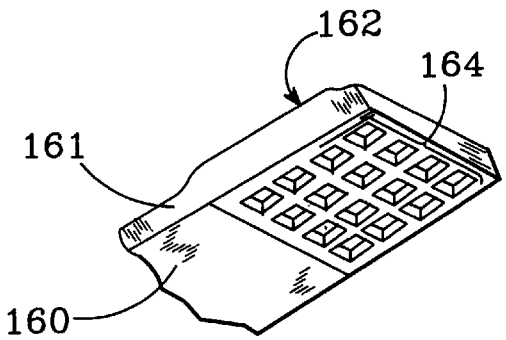
FIG. 8 is a perspective view of the underside of the free end of a cantilever beam, fabricated with depressions to increase the beam's stiffness.

Additional mechanical stiffness and thus optical flatness is obtainable in the area of the reflective surface by further increasing the thickness of the beam in the area of the mesa structure. In FIG. 8, a perspective view of the underside 160 of the free end of a cantilever beam 161 is shown. The thickness of the beam in the mesa structure and reflective surface area 162 is increased from that discussed before, i.e., from about 15 $\mu$m to about 20–25 $\mu$m, which adds stiffness in the mesa area as well as improving the optical flatness of the reflective area. However, the added thickness increases the weight and mass of the beam, which affects its resonant frequency values. To compensate, depressions 164, typically about 5–6 $\mu$m deep, are preferably made in the bottom surface of the beam opposite the mesa structure 162, to keep the beam's weight about the same as it was for the 15 $\mu$m thick mesa and to allow its resonant frequencies to be tuned.

Figure 9A:
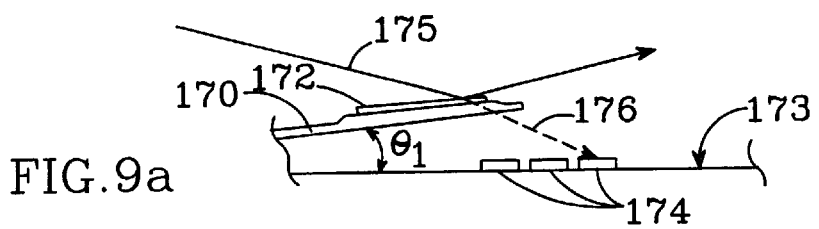
FIGS. 9a and 9b are sectional views illustrating the operation of a beam position detection scheme using a photodetector array.

Some scanning systems require that the position of the reflective surface be known as it oscillates. Two position detection schemes are shown in FIGS. 9 and 10. In FIG. 9a, a partial sectional view of a cantilever beam 170 and reflective surface 172 are shown, which is at a particular angle $\theta_1$ with respect to the surface 173 beneath the beam. An photodetector array 174 is also located on the surface 173. A light source directs light 175 onto the reflective surface 172, which reflects it to create a scanning line. The reflective surface 172 is made thin enough so that some of the incoming light 175 passes through the surface. The surface will deflect the light as it passes through, with the angle of deflection affected by the angle of the reflective surface with respect to the incoming light. The array 174 is positioned so that the deflected light 176 strikes at least one photodetector.

Figure 9B:
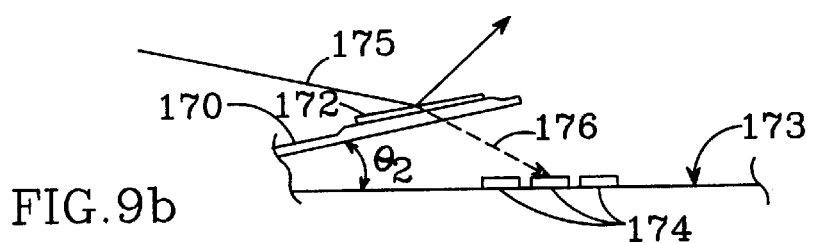
Figure 10:
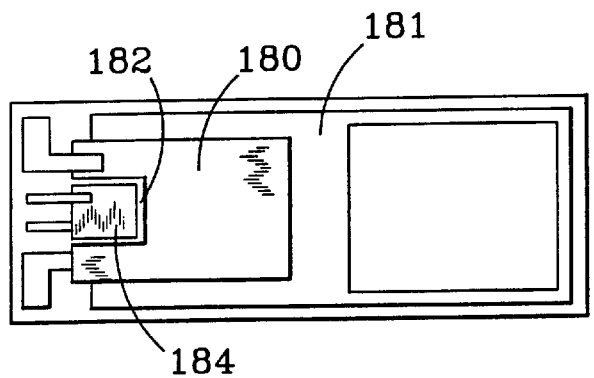
FIG. 10 is a plan view of a cantilever beam/actuator configuration illustrating the use of a stack of layers to generate a piezoelectric current for use with a beam position detection scheme.

In FIG. 9b, the beam has moved to a second angle $\theta_2$ with respect to the surface 173. Incoming light 175 passes through reflective surface 172, and is deflected onto array 174, striking a different photodetector. By processing the signals produced by array 174, the position of the beam can be ascertained.

The technique discussed in connection with FIG. 9 is only useful when the incoming light 175 is at a wavelength which passes through the silicon cantilever beam, such as an infrared wavelength of about 1.2$\mu$. When the reflective surface 172 is coated with a metallic layer, the layer must be made thin enough so that some of the incoming light passes through it.

Another position detection scheme is shown in FIG. 10, which depicts a plan view of an optical resonator per the present invention. Bimorph actuator 180 comprises a stack of layers as before, including a substrate, oxide layer, bottom and top metal layers and a bimorph material layer, atop a cantilever beam 181. The actuator 180 is preferably fabricated with a cut-out area 182. A second stack of layers 184, physically separate from actuator 180 but preferably having the same composition of layers so that it can be fabricated simultaneously with it, is located in the cut-out area 182. The stresses to which stack 184 is exposed due to the actuator-induced movement of the beam generates a piezoelectric current which varies with the beam's position. By processing the signal produced by stack 184, the position of the beam can be ascertained. It is not required that the stack 184 be located in the middle of the bimorph actuator 180. Positioning the stack 184 so that it is subjected to stresses similar to those experienced by the actuator, such as near the middle of the actuator or near one of its edges, will suffice.

While particular embodiments of the invention have been shown and described, numerous variations and alternate embodiments will occur to those skilled in the art. Accordingly, it is intended that the invention be limited only in terms of the appended claims.

We claim:

1. An integrated optical resonator, comprising:

a silicon substrate, a cantilever beam affixed at one end to said substrate, at least a portion of said beam having a reflective surface, and a first bimorph actuator affixed to said cantilever beam and responsive to a first electrical stimulus, said actuator causing said beam to move in accordance with said first stimulus.

2. The resonator of claim 1, wherein said cantilever beam is silicon.

3. An integrated optical resonator, comprising:

a substrate, a cantilever beam affixed at one end to said substrate, at least a portion of said beam having a reflective surface, and a first bimorph actuator affixed to said cantilever beam and responsive to a first electrical stimulus, said actuator causing said beam to move in accordance with said first stimulus, wherein said bimorph actuator comprises a plurality of stacked material layers on said cantilever beam, at least two of said first actuator's layers having unequal thermal expansion coefficients.

4. The resonator of claim 3, wherein said beam has a rest position and at least two of said layers comprise electrodes, said electrodes arranged such that a current flowing between them causes said first actuator to heat and said beam to move away from said rest position, and a reduction in current flowing between said electrodes causes said first actuator to cool and said beam to move towards said rest position.

5. The resonator of claim 4, wherein said electrodes comprise gold with a thin titanium film adhesion layer.

6. The resonator of claim 4, wherein one of said layers comprises a bimorph material which is sandwiched between said electrodes.

7. The resonator of claim 6, wherein said bimorph material comprises zinc oxide.

8. The resonator of claim 6, wherein said bimorph material has a resistivity of $10^3$ to $10^4$ $\Omega$-cm.

9. The resonator of claim 3, further comprising a second bimorph actuator affixed to said cantilever beam and responsive to a second electrical stimulus, said second actuator causing said beam to move in accordance with said second stimulus, said first and second actuators each comprising a respective plurality of stacked material layers on said cantilever beam, each actuator including at least two layers having unequal thermal expansion coefficients.

10. The resonator of claim 9, wherein said beam has a rest position and three of said layers comprise first, second and third electrodes, said first and second electrodes comprising the top layers of said first and second actuators, respectively, said electrodes arranged such that a current flowing between said first and third electrodes causes said beam to twist in a first direction and current flowing between said second and third electrodes causes said beam to twist in a second direction.

11. The resonator of claim 3, wherein said reflective surface comprises a layer of metallization forming a mirror.

12. The resonator of claim 3, wherein said beam includes a mesa structure which forms a beam section which is thicker and stiffer than the remainder of said beam and said reflective surface is atop said mesa structure.

13. The resonator of claim 12, wherein the underside of said mesa structure includes at least one depression to reduce the weight of said cantilever beam.

14. The resonator of claim 3, wherein said cantilever beam has an associated fundamental resonant frequency and an excursion distance which varies with said stimulus, said excursion distance increased when said actuator is stimulated at said fundamental resonant frequency.

15. The resonator of claim 14, further comprising actuator excitation circuitry arranged to provide stimulation to said actuator at about said resonant frequency.

16. The resonator of claim 14, wherein said cantilever beam has an associated orthogonal resonant frequency such that, when stimulated at said orthogonal resonant frequency said beam oscillates in a direction orthogonal to that followed when stimulated at said fundamental resonant frequency.

17. The resonator of claim 16, further comprising actuator excitation circuitry arranged to provide stimulation to said actuator at both said fundamental and said orthogonal frequencies, said frequencies frequency-multiplexed, said resonator suitable for providing 2D scanning.

18. The resonator of claim 3, wherein the width of said first bimorph actuator is narrow with respect to the width of said reflective surface, said narrow actuator allowing said beam to twist easier than a wider actuator.

19. The resonator of claim 3, wherein said bimorph actuator is arranged in a U-shape, the legs of the U contacting said beam along respective edges, said contact along said edges tending to prevent said beam from twisting.

20. An integrated optical resonator, comprising:
a substrate,
a cantilever beam affixed at one end to said substrate, at least a portion of said beam having a reflective surface, and
a first bimorph actuator affixed to said cantilever beam and responsive to a first electrical stimulus, said actuator causing said beam to move in accordance with said first stimulus, wherein said reflective surface comprises a single-surface collimator, said collimator suitable for collimating light emitted from a laser diode.

21. An integrated optical resonator, comprising:
a substrate,
a cantilever beam affixed at one end to said substrate, at least a portion of said beam having a reflective surface, said cantilever beam having an associated fundamental resonant frequency and an excursion distance which varies with said stimulus, said excursion distance increased when said actuator is stimulated at said fundamental resonant frequency,
a first bimorph actuator affixed to said cantilever beam and responsive to a first electrical stimulus, said actuator causing said beam to move in accordance with said first stimulus, and
actuator excitation circuitry arranged to provide stimulation to said actuator at about said resonant frequency, wherein said actuator excitation circuitry and said resonator are integrated on said substrate.

22. An integrated optical resonator, comprising:
a substrate,
a cantilever beam affixed at one end to said substrate, at least a portion of said beam having a reflective surface, said cantilever beam having an associated fundamental resonant frequency and an excursion distance which varies with said stimulus, said excursion distance increased when said actuator is stimulated at said fundamental resonant frequency, said cantilever beam also having an associated orthogonal resonant frequency such that, when stimulated at said orthogonal resonant frequency said beam oscillates in a direction orthogonal to that followed when stimulated at said fundamental resonant frequency,
a first bimorph actuator affixed to said cantilever beam and responsive to a first electrical stimulus, said actuator causing said beam to move in accordance with said first stimulus, and
actuator excitation circuitry arranged to provide stimulation to said actuator at both said fundamental and said orthogonal frequencies, said frequencies time-multiplexed, said resonator suitable for providing 2D scanning.

23. An integrated resonator suitable for use in an optical scanner engine, comprising:
a substrate,
a cantilever beam affixed at a first end to said substrate and extending freely over said substrate at a second end, at least a portion of said free end having a reflective surface, and
a bimorph actuator affixed to said cantilever beam and responsive to an electrical stimulus, said actuator causing the free end of said beam to move in accordance with said stimulus, said beam being at a rest position in the absence of electrical stimulus to said actuator, said actuator including at least two electrodes arranged such that a current flowing between them causes said actuator to heat and said beam to move away from said rest position, and a reduction in current flowing between said electrodes causes said actuator to cool and said beam to move towards said rest position.

24. An integrated resonator suitable for use in an optical scanner engine, comprising:
a substrate,
a cantilever beam affixed at a first end to said substrate and extending freely over said substrate at a second end, at least a portion of said free end having a reflective surface, and
a bimorph actuator affixed to said cantilever beam and responsive to an electrical stimulus, said actuator causing the free end of said beam to move in accordance with said stimulus, said beam being at a rest position in the absence of electrical stimulus to said actuator, said actuator including at least two electrodes arranged such that a current flowing between them causes said actuator to heat and said beam to move away from said rest position, and a reduction in current flowing between said electrodes causes said actuator to cool and said beam to move towards said rest position, wherein said actuator comprises a bimorph material layer sandwiched between said electrodes.

25. The resonator of claim 24, wherein said reflective surface comprises a layer of metallization forming a mirror.

26. The resonator of claim 24, wherein said beam includes a mesa structure which forms a beam section which is thicker and stiffer than the remainder of said beam and said reflective surface is atop said mesa structure.

27. The resonator of claim 24, wherein said reflective surface comprises a single-surface collimator, said collimator suitable for collimating light emitted from a laser diode.

28. The resonator of claim 24, further comprising a light source which produces a light output, said output directed at said reflective surface and producing a scanning light beam when said actuator is stimulated.

29. The resonator of claim 28, wherein said light source is a laser.

30. The resonator of claim 28, further comprising a photodetector arranged to receive light from said scanning light beam.

31. An integrated optical resonator, comprising:
a substrate,
a cantilever beam affixed at one end to said substrate, at least a portion of said beam having a reflective surface, said cantilever beam having an associated fundamental resonant frequency and an excursion distance which varies with said stimulus, said excursion distance increased when said actuator is stimulated at said fundamental resonant frequency, said cantilever beam also having an associated higher-order orthogonal resonant frequency such that, when stimulated at said orthogonal resonant frequency said beam oscillates in a direction orthogonal to that followed when stimulated at said fundamental resonant frequency, and a bimorph actuator affixed to said cantilever beam and responsive to a first electrical stimulus, said actuator causing said beam to move in accordance with said first stimulus.

* * * * *